US010305456B2

(12) United States Patent
Zegmout et al.

(10) Patent No.: US 10,305,456 B2
(45) Date of Patent: May 28, 2019

(54) CLOCK SIGNAL GENERATOR

(71) Applicant: STMicroelectronics SA, Montrouge (FR)

(72) Inventors: Hanae Zegmout, Saint-Vincent-de-Mercuze (FR); Denis Pache, Grenoble (FR); Stephane Le Tual, Saint-Egreve (FR)

(73) Assignee: STMicroelectronics SA, Montrouge (FR)

( * ) Notice: Subject to any disclaimer, the term of this patent is extended or adjusted under 35 U.S.C. 154(b) by 137 days.

(21) Appl. No.: 15/605,536

(22) Filed: May 25, 2017

(65) Prior Publication Data

US 2018/0152179 A1 May 31, 2018

(51) Int. Cl.
*H03K 3/42* (2006.01)
*H01S 5/00* (2006.01)
*H03M 1/00* (2006.01)

(52) U.S. Cl.
CPC ............. *H03K 3/42* (2013.01); *H01S 5/00* (2013.01); *H03M 1/00* (2013.01)

(58) Field of Classification Search
CPC .................................. H03K 3/42; H03M 1/00
See application file for complete search history.

(56) References Cited

U.S. PATENT DOCUMENTS

| 3,521,244 | A | * | 7/1970 | Weimer | ............ G06K 7/10841 |
| | | | | | 250/208.3 |
| 4,766,471 | A | | 8/1988 | Ovshinsky et al. | |
| 5,418,360 | A | | 5/1995 | Sokolowska et al. | |
| 7,940,201 | B1 | | 5/2011 | Cosand | |
| 2006/0251427 | A1 | | 11/2006 | Furuyama | |
| 2018/0152180 | A1 | | 5/2018 | Pache et al. | |

FOREIGN PATENT DOCUMENTS

| EP | 0 398 038 A2 | 11/1990 |
| EP | 0 525 819 A1 | 2/1993 |
| JP | 58-18988 A | 2/1983 |

OTHER PUBLICATIONS

Pham et al., "Enhanced Responsivity up to 2.85 A/W of Si-based $Ge_{0.9}Sn_{0.1}$ Photoconductors by, Integration of Interdigitated Electrodes," 2015 Conference on Lasers and Electro-Optics (CLEO), May 10-15, 2015, San Jose, CA, 2 pages.
Broekaert et al., "InP-HBT Optoelectronic Integrated Circuits for Photonic Analog-to-Digital Conversion," *IEEE Journal of Solid-State Electronics* 36(9):1335-1342, 2001.
(Continued)

*Primary Examiner* — Tony Ko
(74) *Attorney, Agent, or Firm* — Seed IP Law Group LLP

(57) ABSTRACT

The present disclosure relates to a device for converting an optical pulse to an electronic pulse includes a photoresistor having first and second terminals and being capable of receiving a pulsed laser signal arising from a mode-locked laser source The first terminal is linked to a node for applying a reference potential via a resistive element and a capacitive element connected in parallel. The second terminal is connected to a node for applying a supply potential.

20 Claims, 3 Drawing Sheets

(56) References Cited

OTHER PUBLICATIONS

Debaes et al., "Receiver-Less Optical Clock Injection for Clock Distribution Networks," *IEEE Journal of Selected Topics in Quantum Electronics* 9(2):400-409, 2003.
French Search Report, dated Aug. 23, 2017, for French Application No. 1661724, 12 pages.
French Search Report, dated Jul. 20, 2017, for French Application No. 1661725, 10 pages.

* cited by examiner

CLOCK SIGNAL GENERATOR

BACKGROUND

Technical Field

The present application relates to an optoelectronic device and, in particular, to a device for generating a clock signal.

Description of the Related Art

FIG. 1 illustrates a clock signal 100 as a function of time. The clock signal is intended to be used by an electronic circuit, for example a high-resolution (e.g., higher than 14 bits) analog-to-digital conversion (ADC) circuit with a high input frequency (e.g., higher than 1 GHz). The clock frequency of the clock signal may be high, for example higher than 100 MHz.

The clock signal 100 comprises electronic pulses 102, each of which starts with a rising edge 104. It would be desirable, for the ADC circuit, for the clock signal to correspond to an ideal signal 108, shown as dashed lines, having successive rising edges separated by a regular duration $t_C$. However, in practice, the rising edges 104 are not perfectly regular and, with respect to the ideal rising edges, the rising edges 104 are premature or delayed by a random duration $\Delta t$. The duration $\Delta t$ corresponds to an instability value, the standard deviation (or RMS value, for Root Mean Square) of which is referred to as jitter. The clock signals generated by current clock devices exhibit high jitter, for example of several tens of femtoseconds (fs). Additionally, while the ideal signal 108 passes instantaneously from a low value to a high value, obtaining a rise time of less than a few picoseconds (ps) proves to be difficult in practice.

BRIEF SUMMARY

One embodiment makes provision for a device overcoming all or some of the drawbacks described above.

One embodiment makes provision for a clock circuit delivering a pulsed signal exhibiting low jitter, for example of less than 10 fs.

One embodiment makes provision for a clock circuit generating a pulse signal having a very short rise time, for example of less than 4 ps.

One embodiment makes provision for a circuit allowing optical pulses to be converted to electronic pulses with a low degree of random offset, for example of less than 10 fs, between the optical pulses and the electronic pulses.

Thus, one embodiment makes provision for a device for converting an optical pulse to an electronic pulse comprising a photoresistor having first and second terminals and being capable of receiving a pulsed laser signal arising from a mode-locked laser source, in which: the first terminal is linked to a node for applying a reference potential via a resistive element and a capacitive element, which are connected in parallel; and the second terminal is connected to a node for applying a supply potential.

According to one embodiment, the product of the capacitance of the capacitive element and the resistance value of the photoresistor in the on state is less than 3 ps.

According to one embodiment, provision is made for the photoresistor to have, during the optical pulse, a resistance value of less than 50Ω.

According to one embodiment, the photoresistor comprises a semiconductor region doped to less than $5*10^{16}$ atoms/cm³ and equipped with two contacts which are separated by a distance of between 3 and 9 µm.

According to one embodiment, the semiconductor region is made of germanium and the center wavelength of the optical pulse is between 1.3 and 1.8 µm.

According to one embodiment, said semiconductor region is an extension of a flared portion of a silicon core of a waveguide.

According to one embodiment, the length of the semiconductor region is between 15 and 20 µm.

According to one embodiment, the first terminal of the photoresistor is linked to the input of an amplifier.

According to one embodiment, the resistance value of the resistive element is between the resistance values of the photoresistor in the on state and in the off state, for example equal to the square root of the product of the resistance values of the photoresistor in the on state and in the off state.

According to one embodiment, the product of the capacitance of the capacitive element and the resistance value corresponding to the photoresistor in the off state in parallel with the resistive element corresponds to a duration of more than 100 ps.

One embodiment makes provision for a clock signal generator comprising the device as described above.

BRIEF DESCRIPTION OF THE SEVERAL VIEWS OF THE DRAWINGS

These features and advantages, along with others, will be presented in detail in the following description of particular embodiments, provided without limitation and in relation to the appended figures among which.

DETAILED DESCRIPTION

Identical elements are denoted by the same references in the various figures and, furthermore, the various timing diagrams and views are not drawn to scale. For the sake of clarity, only those elements which are of use in understanding the described embodiments are shown and described in detail. In particular, the laser sources emitting optical pulses and the circuits using electronic pulses are not shown in detail.

Throughout the following description, unless specified otherwise, the expressions "substantially", and "of the order of" signify to within 10%, preferably to within 5%.

Throughout the present description, the term "connected" denotes a direct electrical connection between two elements, while the term "coupled" or "linked" denotes an electrical connection between two elements that may be direct or take place via one or more passive or active components, such as resistors, capacitors, inductors, diodes, transistors, etc.

In order to obtain a pulsed clock signal exhibiting low jitter, it is proposed here to convert optical pulses delivered by a laser source of mode-locked type to electronic pulses. Such a source generates a pulsed laser signal having extremely low jitter, typically of less than 10 fs, and exhibiting extremely straight edges with rise and fall times of less than 100 fs, for example.

Figure 1:
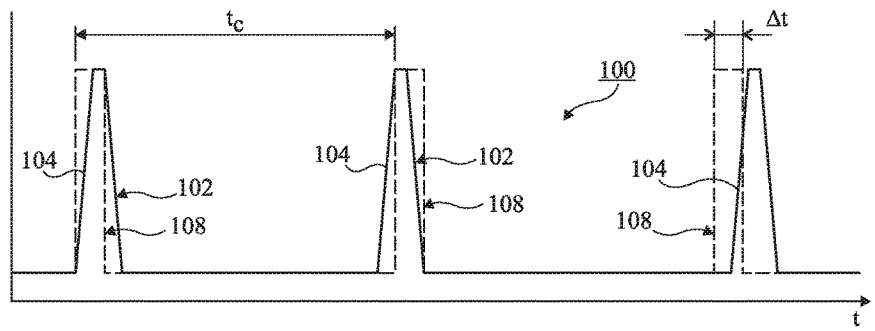
FIG. 1, described above, illustrates a clock signal as a function of time.
Figure 2:
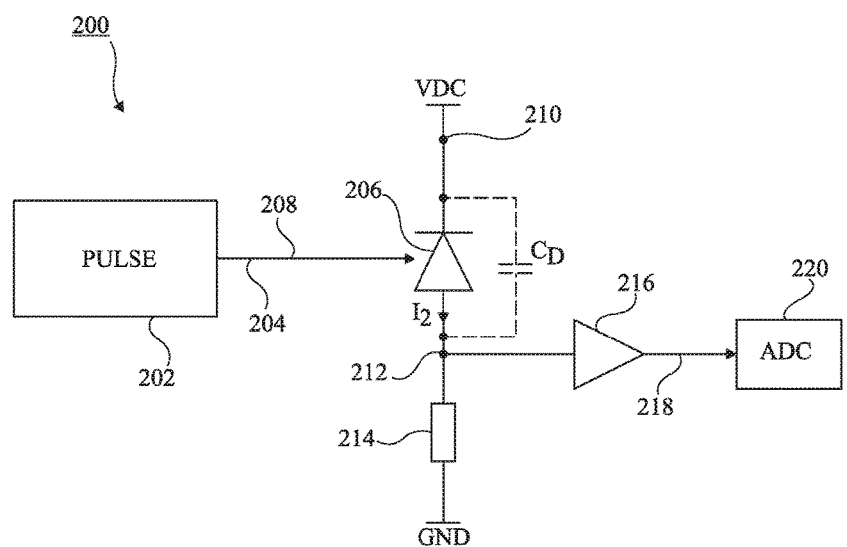
FIG. 2 is a schematic representation of a clock device.

FIG. 2 is a representation of a clock device 200. The clock circuit comprises a pulsed laser source 202 (PULSE) designed to generate a pulsed laser signal 204.

A photodiode 206 is linked to the pulsed laser source 202 via a waveguide 208. The presence of the waveguide does not increase the jitter of the laser signal, but does slightly increase the rise and fall times, which remain very short, typically less than a few ps. The cathode of the photodiode 206 is connected to a node 210 for applying a high potential VDC, and the anode thereof is connected to a node 212 that is linked, via a resistive element 214, to a node for applying a reference potential, for example a ground GND. The node 212 is linked to the input of a voltage amplifier 216, which delivers a clock signal 218 intended for an ADC circuit 220, for example.

In operation, upon each optical pulse, the photodiode generates a photocurrent $I_2$, which triggers a clock signal pulse 218. One problem is that it is difficult for the ADC circuit 220 to use the obtained clock signal when this circuit is a high-resolution circuit with a high input frequency Specifically, if it is desired to obtain a photodiode that is able to convert almost all of the optical radiation of the laser to photocurrent, then the dimensions of this photodiode must be sufficient to do so. The capacitance $C_D$ of the photodiode is then high between its cathode and its anode, typically being more than 1 pF for a high potential VDC of between 0.5 and 2 V. The capacitance $C_D$ increases the rise time of the pulses of the clock signal 218, thereby causing the ADC circuit to have operating problems similar to those caused by high jitter in the clock signal.

It is possible to seek to decrease the capacitance $C_D$ of the photodiode by decreasing the dimensions of the photodiode, but doing so inevitably decreases the intensity of the photocurrent $I_2$ generated. The variations in the potential of the node 212 are then difficult to distinguish from the level of noise generated by the photodiode 206 and by the resistive element 214. This noise creates a high level of jitter in the clock signal, for example of more than 50 fs, despite the extremely low jitter of the pulsed laser signal 204.

In order to overcome these problems, it would be possible to try replacing the photodiode with a photodiode of PIN type, or with a phototransistor, for example, but this would pose problems with integration, fabrication and implementation.

A clock device is proposed here that is based on the conversion of a pulsed laser signal to an electronic clock signal, in which the conversion between optical pulses and electronic pulses is carried out while preserving short rise times, and without adding any substantial jitter to the optical pulses.

Figure 3A:
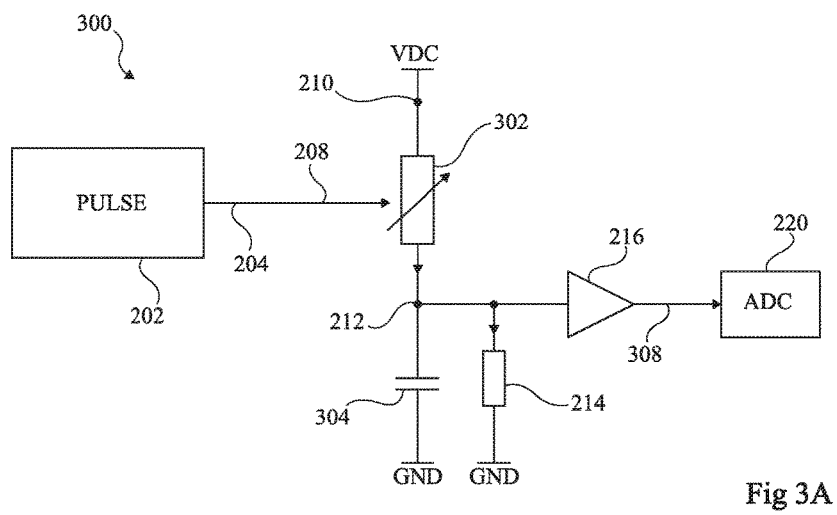
FIG. 3A is a schematic representation of an exemplary embodiment of a clock device.

FIG. 3A represents an exemplary embodiment of a clock device 300 based on the conversion of an optical signal to an electronic signal.

The device 300 differs from the device 200 of FIG. 2 in that it comprises a photoresistor 302 instead of the photodiode 206 of the device 200. The photoresistor 302 comprises a semiconductor region that is either intrinsic or lightly doped, for example to less than $5*10^{16}$ atoms/cm$^3$ or to a level of the order of $5*10^{16}$ atoms/cm$^3$, preferably with germanium in the case of a laser center wavelength of which is located in the near infrared and is for example between 1.3 and 1.8 μm. This semiconductor region is equipped, on either side, with two contacts separated by a distance of between 3 and 9 μm, for example of the order of 8 μm.

Furthermore, the device 300 comprises elements that are similar to those of the device 200 of FIG. 2, and which are arranged in a similar manner. Thus, the photoresistor 302 links a node 210 for applying the potential VDC to a node 212 that is coupled to ground via a resistor 214, the node 212 being coupled to the input of an amplifier 216 the output of which is coupled to an ADC circuit 220.

The device 300 additionally comprises a capacitive element 304 linking the node 212 to ground GND. A capacitance value C represents that of the capacitive element 304 and of all other elements connected to the node 212. As a variant, the capacitive element 304 may be an input capacitor of the amplifier 216.

Figure 3B:
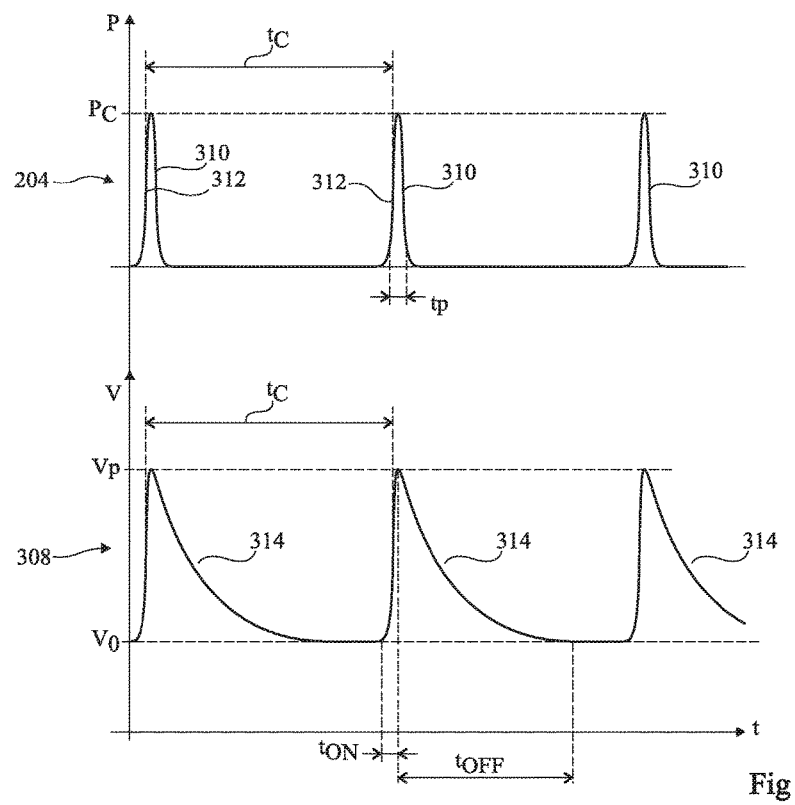
FIG. 3B is a timing diagram illustrating a laser signal and a clock signal in the device of FIG. 3A.

FIG. 3B is a timing diagram illustrating, as a function of time, in the device 300 of FIG. 3A in operation, the pulsed laser signal 204 and the clock signal 308, which is delivered by the amplifier 216.

The level of the pulsed laser signal 204 corresponds to the power P of the optical radiation received by the photoresistor 302. The pulsed laser signal 204 comprises pulses 310 of peak power $P_C$, between which no meaningful optical radiation is received by the photoresistor. By way of example, the mean power of the laser signal is higher than 10 mW. The optical pulses 310 have rising edges 312 separated by a duration $t_C$. By way of example, the laser source 202 is designed so that the duration $t_C$ is less than 10 ns, preferably less than 1 ns. By way of example, the laser source 202 and the waveguide 208 are chosen so that the duration $t_P$ of the optical pulses 310 is less than 4 ps, during which the power P is higher than half of the peak power $P_C$. Between the optical pulses 310, the photoresistor 302 has a high resistance value $R_{OFF}$. During the optical pulses, the resistance value of the photoresistor 302 passes to a low resistance value $R_{ON}$.

The photoresistor 302 of the device 300 is chosen so that the product of its resistance value $R_{ON}$ and the capacitance value C corresponds to a short duration, for example of less than the duration of the optical pulses 310, for example of less than 3 ps. Additionally, the resistance value $R_{ON}$ is chosen to be low, for example the resistance value $R_{ON}$ is chosen to be less than 50Ω, preferably less than 15Ω. Furthermore, the difference between the high VDC and low GND potentials is for example between 0.5 and 2 V. The value R of the resistor 214 is for example between 0.2 and 5 kΩ.

For each optical pulse 310 there is a corresponding electronic pulse 314 of the clock signal 308. During each rising edge of the pulses 314, the level V of the signal 308 increases from an initial value $V_0$ and reaches a peak value $V_P$ after a rise time $t_{ON}$. The level V next decreases over a fall phase to reach the value $V_0$ after a fall time $t_{OFF}$.

Because the product $R_{ON}*C$ is small, the rise time $t_{ON}$ of the clock signal is short, for example less than 4 ps. In order to achieve this, an amplifier 216 is chosen that is fast enough not to meaningfully increase the rise time of the voltage on the node 212.

Additionally, because the product $R_{ON}*C$ is small, and because the resistance $R_{ON}$ is low, the clock signal 308 delivered by the device 300 exhibits particularly low jitter, for example of less than 10 fs. Specifically, a low resistance value $R_{ON}$ allows a capacitance C to be chosen that is sufficient to obtain a particularly low noise level of the voltage of the node 212 during the rising edges of the clock signal 308. This low noise level, associated with a short rise time, allows the jitter of the voltage of the node 212 to be low.

It should be noted that, contrary to a common assumption regarding photoresistors, the reaction times of the photoresistor 302 are short enough to allow signals the frequencies of which are as high as those of the pulsed laser signal 204 to be converted. In particular, contrary to this assumption, the photoresistor 302 is fast enough for its resistance value to have the time to return to the resistance value $R_{OFF}$ after each optical pulse 310. In order to achieve this, as mentioned above, provision has been made for the contacts on either side of the semiconductor region in the photoresistor 302 to be separated by a short distance, for example of less than 9 µm. This distance is chosen so that charge, generated in the semiconductor region upon each optical pulse and which then allows a current to flow through the photoresistor, recombines at the contacts after a time of less than 1 ns, for example.

Furthermore, the resistance value $R_{OFF}$ of the photoresistor 302 is high, for example higher than the resistance value R of the resistor 214. The capacitive element 304 makes it possible to obtain fall times $T_{OFF}$ of the pulses 314 of the clock signal 308 that are long enough for the duration of the pulses 314 to be sufficient to allow the clock signal 308 to be used by the ADC circuit 220. By way of example, the product of the capacitance C and the resistance value of a resistor of value $R_{OFF}$ in parallel with a resistor of resistance value R corresponds to a duration of more than 100 ps.

By way of example, provision is made for the resistive element 214 to be formed by a photoresistor that is similar to the photoresistor 302 which is not subjected to the optical radiation of the laser. Substantially equal values of R and $R_{OFF}$ are thus obtained. As a variant, the resistance value R is between $R_{ON}$ and $R_{OFF}$, for example equal to the square root of the product $R_{ON}*R_{OFF}$, allowing the difference between the low and high levels of the voltage of the node 212 to be optimized.

Figure 4A:
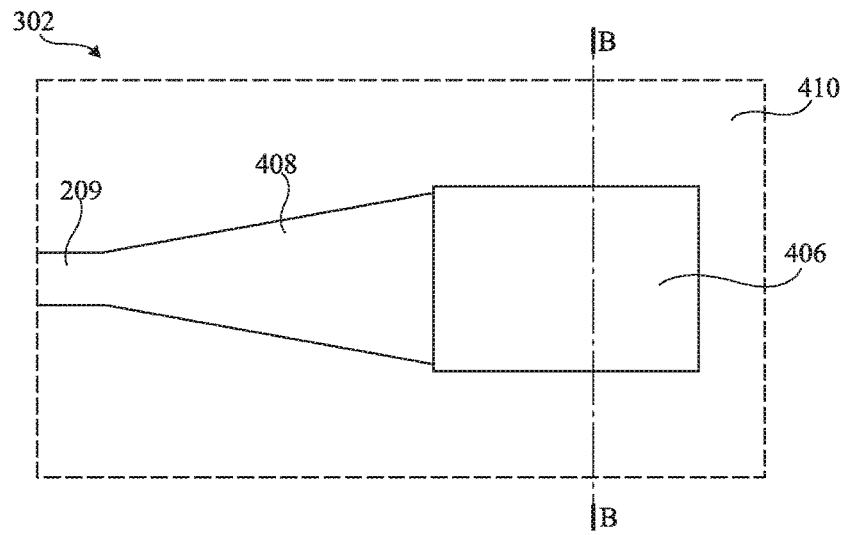
FIGS. 4A and 4B are schematic views from above and in cross section, respectively, of an exemplary embodiment of the photoresistor of the clock device of FIG. 3A.
Figure 4B:
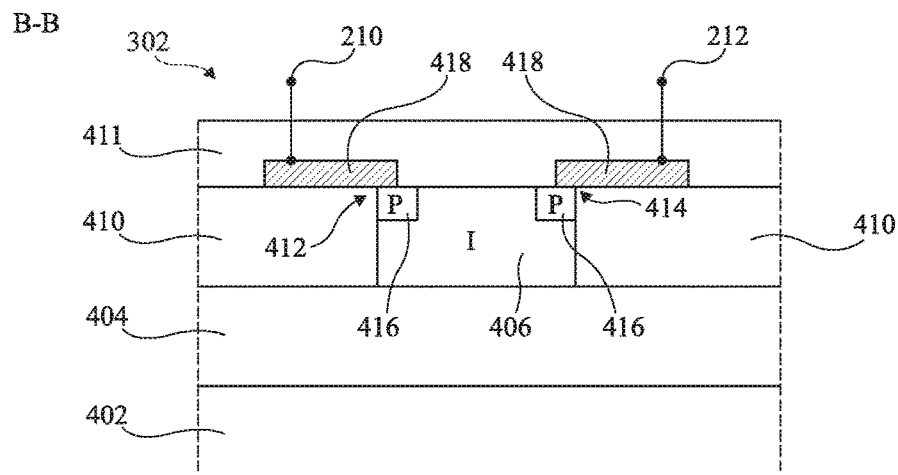

FIGS. 4A and 4B are schematic views from above and in cross section along a plane B-B, respectively, of an exemplary photoresistor 302 of the type of the photoresistor of the device 300. When reference is made here to the terms "on" or "horizontal", it refers to the orientation of the element in question in FIG. 4B, it being understood that, in practice, the described structure may be oriented differently.

The photoresistor 302 comprises, on a carrier 402 covered with a layer 404 of silicon oxide, a region 406 made of germanium located on an extension of a flared portion 408 of the end of a waveguide core 209 of the waveguide 208. The core 209, the flared portion 408 and the region 406 rest on the layer 404 and are for example substantially equal in thickness. When seen from above, the region 406 takes the form, for example, of a rectangle, one short side of which is in contact with the flared portion 408. A layer 410 of silicon oxide covers the layer 404 outside the core 209, outside the flared portion 408 and outside the region 406, which are flush with the surface of the layer 410. The structure is covered with a layer 411 of silicon oxide. The waveguide core 209, its flared portion 408 and the region 406 are thus surrounded by silicon oxide.

The region 406 is equipped with contacts 412 and 414 on the upper portion, on either side of the region 406, in contact with the layer 410. Exemplary contacts 412 and 414 are shown in detail in the cross-sectional view of FIG. 4B. Each contact comprises a doped region 416, for example a p-doped region, in contact with a metallization 418, which may extend over the layer 410 while being kept away from the region 406. The doped regions 416 of the contacts 412 and 414 are of the same conductivity type. Each doped region 416 and the associated metallization 418 may extend, as seen from above, over the entirety of one side of the region 406. The contacts 412 and 414 form the terminals of the photoresistor, and are linked to the nodes 210 and 212 of the device 300.

The germanium region 406 is intrinsic, i.e., not intentionally doped, or exhibits a low level of doping, for example of less than $5*10^{16}$ atoms/cm$^3$, or to a level of the order of $5*10^{16}$ atoms/cm$^3$, of the same conductivity type as the regions 416.

By way of example, the transverse dimensions of the core 208 are between 300 nm and 3 µm, for example the core 208 has a rectangular cross section of 300 nm in the direction of the thickness of the layers and 500 nm horizontally. By way of example, the width of the rectangle delineated by the region 406, as seen from above, is between 3 and 9 µm. By way of example, the length over which the photoresistor extends from the flared portion 408, or length of the photoresistor, is between 15 and 20 µm.

In operation, a laser source emits optical radiation, the center wavelength of which is between 1.3 and 1.8 µm for example, 1560 nm for example. This radiation propagates through the waveguide 208 without being absorbed to any meaningful degree, and reaches the region 406. By virtue of the region 406 being made of germanium, the optical radiation is absorbed thereby and causes current to flow between the contacts 412 and 414.

By virtue of the region 406 made of germanium being on an extension of the flared portion 408 of the waveguide 208, the optical radiation efficiently penetrates the region 406 before being absorbed thereby. A particularly high rate of conversion of the optical radiation to current is obtained, allowing a low resistance $R_{ON}$ in the on state. Additionally, as mentioned above, a photoresistor has been obtained that makes it possible to achieve this conversion at high frequencies, for example of more than 100 MHz.

Particular embodiments have been described. Various variants and modifications will be apparent to those skilled in the art. In particular, in the device 300 of FIG. 3A, the resistive element 214 and the amplifier 216 form a circuit for converting an input current arising from the node 212 to a voltage corresponding to the clock signal 308. It would be possible to replace the resistive element 214 and the amplifier 216 with any other suitable current-voltage conversion circuit. By way of example, the amplifier 216 of the conversion circuit of the device 300 is omitted and the node 212 is connected directly to the circuit 220. The current-voltage conversion circuit may then comprise the single resistive element 214 and/or an input resistor of the circuit 220 linking the node 212 to ground GND.

Furthermore, in the embodiments described, it is possible, as a variant, to exchange the low GND and high VDC potentials and thus obtain falling edges. It is also possible to invert the rising and falling directions of the edges of the clock signal, for example by replacing the amplifier 216 with an inverter amplifier. Thus, it is possible to obtain rising fronts by exchanging the positions of the resistor 214 and the photoresistor 302 and by replacing the amplifier with an inverter amplifier.

Although, in the embodiments described, the electronic circuit 220 receiving a clock signal is an analog-to-digital converter, the clock signal may be used by any circuit employing a clock signal to operate, for example a digital or logic circuit, or it may be employed, for example, as a reference signal in a phase-locked loop (PLL).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device for converting an optical pulse to an electronic pulse, comprising:
a photoresistor having first and second nodes and being configured to receive a pulsed laser signal from a mode-locked laser source;
a reference potential node configured to receive a reference potential;
a resistive element coupled between the reference potential node and the first node of the photoresistor;
a capacitive element coupled in parallel with the resistive element between the reference potential node and the first node of the photoresistor; and
a supply potential node configured to receive a supply potential, the second node of the photoresistor coupled to the supply potential node.

2. The device according to claim 1, wherein the product of a capacitance of the capacitive element and a resistance value of the photoresistor in an on state is less than substantially 3 ps.

3. The device according to claim 2, wherein the resistance value of the photoresistor in the on state is less than substantially 50 ohms.

4. The device according to claim 3, wherein the photoresistor comprises a semiconductor region doped to less than $5*10^{16}$ atoms/cm$^3$ and including with two contacts which are separated by a distance substantially between 3 and 9 μm.

5. The device according to claim 4, wherein the semiconductor region is made of germanium and the center wavelength of the optical pulse is substantially between 1.3 and 1.8 μm.

6. The device according to claim 5 further comprising a waveguide including a silicon core having a flared portion, and wherein said semiconductor region is on an extension of the flared portion of the silicon core of the waveguide.

7. The device according to claim 6, wherein a length of said semiconductor region is substantially between 15 and 20 μm.

8. The device according to claim 7 further comprising an amplifier having an input, and wherein the first node of the photoresistor is coupled to the input of the amplifier.

9. The device according to claim 8, wherein a resistance value of the resistive element is between the resistance value of the photoresistor in the on state and a resistance value of the photoresistor in the off state.

10. The device according to claim 9, wherein the resistance value of the resistive element is substantially equal to the square root of the product of the resistance values of the photoresistor in the on state and in the off state.

11. The device according to claim 9, wherein the product of the capacitance of the capacitive element and a resistance value corresponding to the photoresistor in the off state in parallel with the resistance value of the resistive element corresponds to a duration of more than 100 ps.

12. A clock signal generator, comprising:
a pulsed laser source circuit configured to generate a pulsed laser signal;
a waveguide coupled to the pulsed laser source circuit to receive the pulsed laser signal; and
a clock circuit including a first photoresistor coupled to the waveguide to receive the pulsed laser signal and coupled to a resistive and capacitive node, the clock circuit configured to generate a clock signal on the resistive and capacitive node responsive to the pulsed laser signal.

13. The clock signal generator of claim 12, wherein the first photoresistor has an on state resistance value and an off state resistance value and wherein the clock circuit further comprises a resistor having substantially the off state resistance value coupled between the resistive and capacitive node and a reference node configured to receive a reference potential.

14. The clock signal generator of claim 13, wherein the resistor comprises a second photoresistor.

15. The clock signal of claim 13, wherein the clock circuit further comprises an amplifier circuit having an input coupled to the resistive and capacitive node and having an output, the amplifier circuit configured to provide a driving clock signal on the output responsive to the clock signal on the resistive and capacitive node.

16. The clock signal generator of claim 15, wherein the first photoresistor comprises a semiconductor region doped to less than $5*10^{16}$ atoms/cm$^3$ and including with two contact regions formed in the semiconductor region and separated by a distance substantially equal to between 3 and 9 μm.

17. The clock signal generator of claim 12, wherein the pulsed laser source circuit is configured to generate the pulsed laser signal having successive rising edges separated by a duration of less than approximately 1 nanosecond.

18. A method of generating a clock signal, comprising:
generating a laser signal including a plurality of pulses;
coupling the plurality of pulses of the laser signal to a photoresistor, the photoresistor having a resistance value that varies as a function of the plurality of pulses of the laser signal; and
generating a clock signal on a resistive and capacitive node in response to variations in the value of the photoresistor.

19. The method of claim 18, wherein coupling the pulses of the laser signal to the photoresistor comprises propagating the laser signal through a waveguide.

20. The method of claim 19, wherein a variable current flows through the photoresistor to the resistive and capacitive node responsive to variations in the value of the photoresistor, and wherein generating the clock signal comprises performing a current-to-voltage conversion of the current flowing through the photoresistor to the resistive and capacitive node.

* * * * *